United States Patent [19]

Hamacher

[11] Patent Number: 4,698,456
[45] Date of Patent: Oct. 6, 1987

[54] ELECTRICAL DEVICE FOR USE IN AN EXPLOSIVE ENVIRONMENT

[76] Inventor: Martin Hamacher, Westerholter Strasse 791, D-4352 Herten, Fed. Rep. of Germany

[21] Appl. No.: 783,841

[22] Filed: Oct. 3, 1985

[30] Foreign Application Priority Data

Oct. 20, 1984 [DE] Fed. Rep. of Germany ....... 3438522

[51] Int. Cl.$^4$ .......................... H05K 5/06; H02G 3/18
[52] U.S. Cl. ..................................... 174/11 R; 174/18
[58] Field of Search .............. 174/11 R, 11 BH, 17 R, 174/17 GF, 17 CT, 18, 151, 152 R, 153 R; 200/302.1

[56] References Cited

U.S. PATENT DOCUMENTS 1,703,409 2/1929 Smith ................................. 174/18 X
2,957,064 10/1960 Comenetz ....................... 174/151 X
3,819,846 6/1974 Jakobsen ........................... 174/11 R

FOREIGN PATENT DOCUMENTS 2539456 5/1982 Fed. Rep. of Germany ... 174/65 SS

*Primary Examiner*—Laramie E. Askin
*Attorney, Agent, or Firm*—Browdy & Neimark

[57] ABSTRACT

A pressurizable housing for an electrical apparatus which can be used in an explosive environment has a cable feedthrough connected to an electrical unit within the housing. The cable feedthrough also accommodates a passage for pressurizing the interior of the housing with a gas excluding the incursion of explosive gases into the housing.

8 Claims, 7 Drawing Figures

ELECTRICAL DEVICE FOR USE IN AN EXPLOSIVE ENVIRONMENT

FIELD OF THE INVENTION

My present invention relates to an electrical device and, more particularly, to an electrical device for use in an explosive environment, for example, in the purpose of fire-damp or some other explosive gas or gas mixture in a subterranean application such as in a mine. The invention especially relates to an electrical device of this type having a housing encapsulating or hermetically enclosing an electrical unit whose operation might cause an explosion in such an environment and connected to an electrical cable traversing a pressure-tight feedthrough in an opening in the housing wall and wherein the housing is provided with means for introducing a gas into the interior of the housing, e.g. to exclude the incursion of explosive gases.

BACKGROUND OF THE INVENTION

Electrical apparatus for use in explosive atmospheres, especially fire-damp environments, e.g. in mine galleries and shafts, requires special construction for safety and the prevention of explosions upon operation of the unit, e.g. a spark-producing switch, contained in the apparatus housing. The goal of the special measures which are used, of course, is to prevent any possible spark generated by the unit from igniting a possibly explosive mixture of gases surrounding the apparatus. However, while the principles of the invention will be described using the requirements for application of such explosive environments as a starting point, it should be emphasized that the use of the apparatus which will be described herein is in no way limited to such explosive environments.

There are various ways of protecting electrical apparatus so as to prevent explosions and for each of the protection techniques, there is a corresponding type of apparatus. Perhaps the technique most generally applied is that of pressure-tight or hermetic encapsulation, whereby the electrical device or unit is enclosed in a pressure-sustaining housing so that any explosion developing within the housing remains contained and is not propagated to the surroundings. Other techniques include plate-protective encapsulation, oil encapsulation and external air introduction (flushing).

In recent years over-pressure encapsulation has been developed. In this technique, the explosion-sensitive unit has been enclosed in a housing which is maintained at a superambient pressure so that the incursion of gas contributing to air constituting an explosive mixture is precluded. The gas which maintains the superatmospheric pressure is usually air or an inert gas, for example, nitgrogen.

The over-pressure encapsulation has the advantage over pressure-retentive encapsulation that the superatmospheric pressure of the gas within the housing excludes the formation of an explosive gas mixture therein so that the danger of an explosion within the housing which must be contained thereby is reduced or eliminated. Since an explosive gas mixture is thereby prevented from coming into contact with the possible spark within the housing in the first place, the reliability and safety of the antiexplosion measure is clearly enhanced by comparison with conventional pressure-retentive techniques in which explosions may occur within the housing.

With time, generally as a result of the fact that seals may not always be perfect, the superambient pressure of the gas within the housing may drop and, consequently, it has been the practice heretofore in over-pressure encapsulation techniques to provide the housing with an additional opening and fitting through which the pressurizing gas is pumped from time to time to maintain the superambient pressure. The fitting is customarily provided with an automatically closing valve, for example, a check valve, blocking reverse flow through this fitting.

It is also common in such systems to provide a pressure sensor within the housing to respond to the gas pressure therein and to provide means which can be monitored externally of the housing, either in the vicinity thereof or at a remote location, to enable the pressurization status of the housing to be continuously or periodically evaluated and to permit automatically or with operator intervention the pumping of additional gas under pressure into the housing to compensate for any pressure drop.

The foregoing discussion makes clear that up to now the housing used for over-pressure encapsulation has had to be of special construction in no small measure because of the need for the additional pressurizing-gas opening and fitting. Naturally this makes it practically impossible to utilize the over-pressure technique on existing pressure-retentive housings which are not provided with such openings and fittings and operated in the conventional manner.

OBJECTS OF THE INVENTION

It is, therefore, the principal object of my present invention to provide an over-pressure encapsulation electrical device or apparatus which is free from the drawbacks outlined above and which, although applicable to specially constructed housings, can also be used by retrofitting an existing pressurizable housing to provide improved safety for an electrical apparatus.

Another object of my invention is to provide an improved electrical apparatus which can be used safely in an explosive environment but which is free from drawbacks of earlier apparatus.

Still another object of this invention is to provide a low-cost and relatively simple device for retrofitting existing pressure-retentive housings for electrical apparatus so that they can operate with the over-pressure techniques.

It is also an object of the invention to provide an improved relatively simple assembly for pressurizing the housing of an electrical apparatus.

SUMMARY OF THE INVENTION

These objects and others which will become apparent hereinafter are attained in accordance with the invention which provides that the pressurizing-gas passage for the pressure-retentive housing of the electrical unit is within a cable feedthrough opening which is provided with a hermetically sealing feedthrough for the electrical cable connected to that unit and thus traversing the opening. Specifically, a passage is formed in the cable which traverses the feedthrough or in the feedthrough itself or both.

The invention is based upon the fact that all electrical housings for electrical units of the type with which the invention is concerned are generally provided with a cable opening traversed by a cable connected to the electric unit and sealed by a feedthrough which is in turn traversed by the cable and fits sealingly into this opening. The invention, therefore, uses the same opening for the pressurizing-gas passage and thereby eliminates the need to form the housing with another opening and fitting for the pressurization purposes.

Accordingly, sealing problems which might be associated with this additional opening and fitting are avoided and it is possible to apply the invention to existing pressure-retentive housings which have not been previously provided with the pressurization means, i.e. to retrofit all existing electrical apparatus housings which are capable of sustaining gas pressure. Clearly, therefore, housings which have been operated in the pressure-containing mode can now also be used with the over-pressure technique.

According to another feature of this invention, the cable is a multiconductor cable with each of the conductors being provided with a respective insulating sheath and an outer insulating sleeve enclosing the conductors and a body of material filling the interstices between the outer sleeve and the conductors and around the conductors. A tube can be provided within the assembly of conductors to form the pressurizing-gas passage and is likewise embedded in the material filling the interstices of the cable.

Alternately, the outer sheath of the cable enclosing the conductors can leave interstices free among and around conductors, these interstices forming a passage for the pressurizing gas. In both of these embodiments, the cable itself also forms the pressurizing-gas passage.

Alternately, the feedthrough can be provided with a passage which can be formed with a check valve and can open directly into the interior of the housing for introducing the pressurizing gas. In a further alternative, the feedthrough may be formed with a passage which opens into one of the cable passages previously mentioned.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
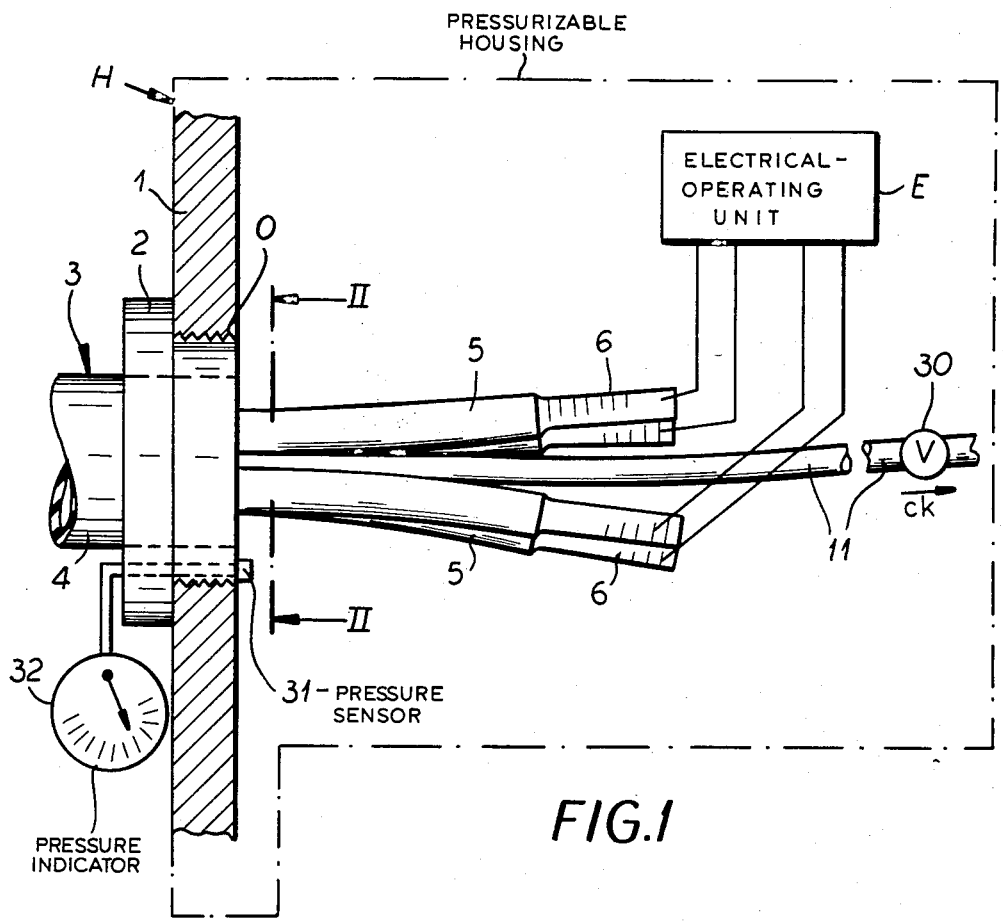
FIG. 1 is a cross section through a portion of the wall of a pressure-retentive housing for an electrical apparatus provided with a feedthrough and cable arrangement including a pressurizing-gas passage according to a first embodiment of the invention.

FIG. 1 shows diagrammatically and only fragmentarily a part of an electrical apparatus which can be used in an explosive environment and which includes an electrical-operating unit E, e.g. a switch, which may cause a spark and thus requires the protective measures described below for preventing explosion in that environment. The unit E is enclosed in a pressurizable housing H of which only one housing wall 1 has been shown in any detail and is illustrated in section in FIG. 1. The opening in this housing wall 1 through which a cable is connected to the unit E may be the only opening through a wall of the housing, although generally the housing may be assembled from a box unit and a cover unit which can be bolted together and sealed via appropriate gaskets.

What is important is that the housing wall 1 is provided with a pressure-tight cable feedthrough 2 which may be of the type described, for example, in German Patent DE-PS No. 25 39 456.

Traversing this cable feedthrough 2 and thereby passing through the housing wall 1 is a cable 3 which, as can be seen from FIG. 1, comprises an outer covering 4 of an electrically-insulating synthetic resin and four conductors 5.

The conductors 5 of the cable 3, in turn, comprise wires 8 forming a core and an insulating sheath 7. The interstices between the conductors and within the outer covering or casing 4 are filled with an electrically-insulating synthetic resin 9 which can be seen in FIG. 2 and is a highly flexible material. In general, the conductors 5 are embedded in the material.

The conductors 5 end within the housing in terminals 6 which may be connected in any conventional manner to the unit E as has been shown diagrammatically in FIG. 1.

Figure 2:
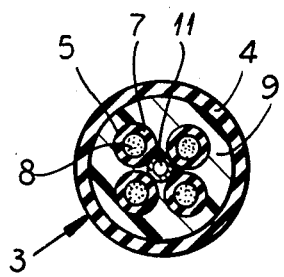
FIG. 2 is a section taken along the line II—II of FIG. 1.

To permit the apparatus of FIGS. 1 and 2 to be utilized for over-pressure encapsulation in the explosive environment, means must be provided to introduce a pressurizing gas to the interior of the pressurizable housing H, the gas generally being air or an inert gas such as nitrogen. For this purpose a pressurizing-gas passage, is provided in accordance with the invention.

In a first embodiment of the invention shown in FIGS. 1 and 2, the pressurizing-gas passage is integrated in the cable 3 and traverses the feedthrough 2. More specifically, the pressurizing-gas passage is formed by a pressurized-gas tube 11 which extends as a further lead through the cable and is embedded in the material 9. The tube 11 can be a synthetic resin tube which can run to the electrical unit from a remote location at which it is connected to a pressurized-gas source, e.g. a compressor.

While FIG. 1 does not show where the tube 11 terminates, it is clear that this tube can terminate anywhere within the housing H and can be provided with a check valve 30 to automatically block reverse flow and prevent escape of gas from the housing H in the intervals between the pumping of gas into the housing.

The feedthrough 2 has on the inner side thereof a pressure sensor 31 which is connected to a pressure indicator 32 at the outer side of the feedthrough so that the pressure within the housing can be easily monitored. Since the pressurized-gas tube 11 extends through the housing wall 1 as part of the cable 3, it does not require any special opening in the latter.

Figure 3:
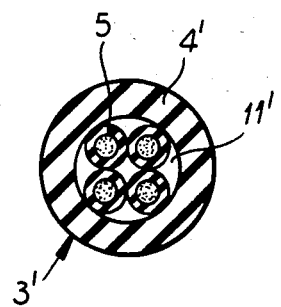
FIG. 3 is a section corresponding generally to that of FIG. 2 but illustrating a variant of the first embodiment of the invention.

FIG. 3 shows a variant of the first embodiment of the invention wherein the cable 3' has an outer casing 4' surrounding the conductors 5 while defining interstices 11' therewith which can define the pressurized-gas passage. Some of these interstices can of course be filled with the material 9 as long as a passage remains for pressurizing the interior of the housing through the cable. The cables 3 and 3' are, of course, connected to appropriate pressurized-gas sources.

Figure 7:
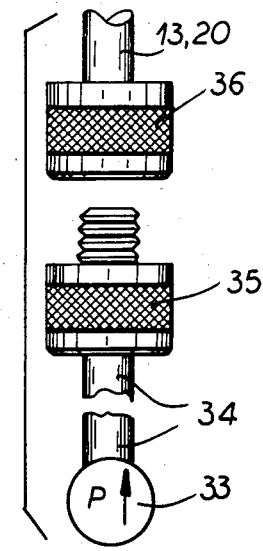
FIG. 7 is an exploded view of a connector for the pressurizing-gas passage of the invention utilizing an automatically opening and self-closing valve.

It is, of course, not essential that the pressurized-gas tube 11 or the passage 11' extend the full length of the cable to the remote point at which the cable may be connected to a control or other electrical appliance. The pressurized-gas tube 11 or the passage 11' may communicate with the pressurizing-gas source directly at the outer side of the feedthrough 2 and such an embodiment has been illustrated in FIGS. 4 and 5. Here the feedthrough 2 is provided with a pressurized-gas unit 12 which has a fitting 13 connectable to an external gas line represented at 14, e.g. via the means shown in FIG. 7. The unit 12 communicates with the tube 11 or passage 11' in the cable 3 or 3'. In either case, the tube 11 or passage 11' need only extend into the unit 12.

Figure 4:
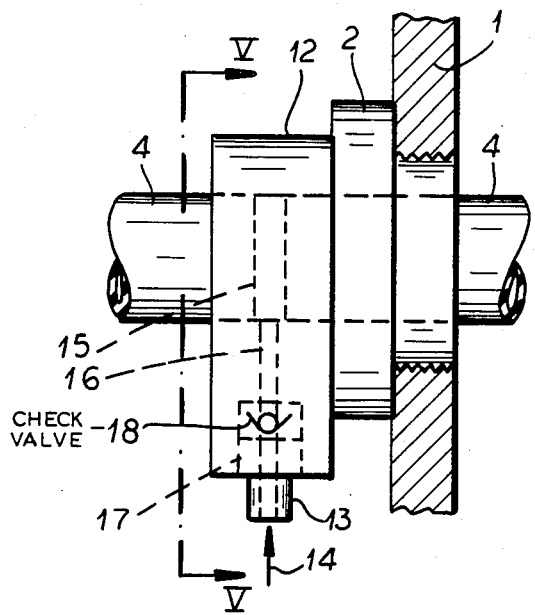
FIG. 4 is a view similar to FIG. 1 but showing a second embodiment of the invention.
Figure 5:
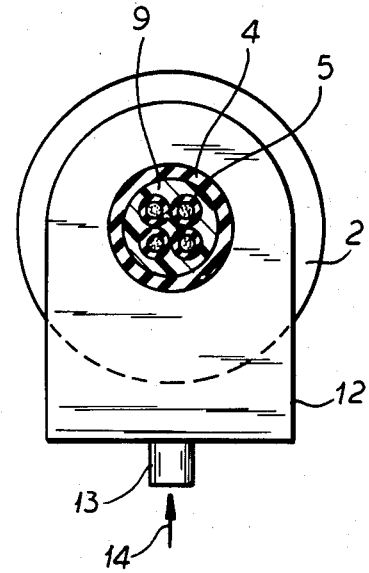
FIG. 5 is a sectional view taken along the line V—V of FIG. 4.

As can be seen from FIG. 4, the unit 12 encloses a short portion of the length of the cable 3 or 3' and can have an annular passage 15 communicating through an appropriate opening in the casing 4 with the passage 11' or with the tube 11 which can extend to the fitting 13. The annular passage 15 is in communication with a pressurized-gas passage 16 communicating with fitting 13. In the region of the annular passage 15, in which the casing 4 is open, the passage 11' of the cable is not completely filled with the material 9 or the tube 11 terminates to allow the pressurized gas to flow into the interior of the housing. The balance of the cable can be filled with the material 9. This has been found to be an especially convenient way of introducing pressurized gas into the housing.

It has been found to be advantageous, moreover, to provide the unit 12 with an insert which can be pressure-fitted or screw-fitted therein and has been represented at 17, this unit defining a check valve 18 for the pressure line.

Figure 6:
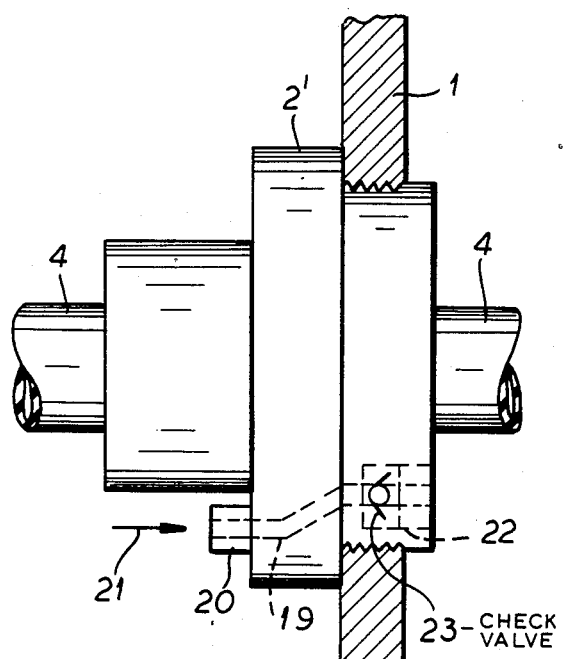
FIG. 6 is another view similar to FIG. 1 showing a third embodiment of the invention.

FIG. 6 shows an embodiment of the invention in which a passage 19 is formed in a feedthrough 2', this feedthrough 2' being formed with a fitting 20 connectable to an external pressurized-gas line 21 represented by an arrow. The feedthrough 2' is formed with an insert 22 which can be forced-fitted into place or screwed into the feedthrough to retain a check valve 23 along the passage 19. The check valve thus is formed in the feedthrough 2' directly.

In all of the embodiments described, the feedthrough 2 or 2' is threaded into the wall of the opening O in the housing wall 1 and, especially where the passage 19 is provided adjacent the cable 3 or 3', this opening will generally be somewhat larger than the diameter of the cable. The threaded openings are customarily provided in housings utilized formerly with the pressure-retentive mode of explosion protection and thus the feedthrough arrangements of the invention can be used with existing housings with ease. Since the check valves 18, 23, etc. are blocked by the superambient pressure within the housing, incursion of gas from the environment is precluded although these valves open automatically upon repressurization. All of the embodiments can be provided with the pressure sensor 31 and the pressure indicator 32 as previously described and wherever fittings are to be connectable to the pressurizing-gas source, this source can be a compressor as represented at 33 in FIG. 7 connected by a hose 34 to a male fitting 35 which engages a female fitting 36 to form a self-blocking coupling of conventional design wherein both fittings 35 and 36 automatically close upon separation and automatically open to permit flow to the fitting 13 or 20 upon joining of the coupling parts 35 and 36.

I claim:

1. An electrical apparatus, especially for use in an explosive environment, comprising:
    a pressure-retention housing having a wall formed with an opening;
    an electrical unit received in said housing;
    a cable feedthrough received in said opening and sealing the interior of said housing from the environment at said opening;
    an electrical cable comprising a plurality of electrical conductors within a sheath, said electrical cable traversing said feedthrough and said electrical conductors being connected to said unit; and
    a passage extending through said feedthrough and into said housing for pressurizing the interior of said housing with a gas under pressure, said passage formed by a pressurizing-gas tube extending through said cable and incorporated therein together with said conductors.

2. The apparatus defined in claim 1, further comprising means on a side of said feedthrough displaced externally of said housing for feeding gas under pressure to said tube.

3. The apparatus defined in claim 1 further comprising a check valve for said tube.

4. The apparatus defined in claim 1 further comprising a pressure sensor formed at a side of said feedthrough located within said housing and a pressure indicator connected to said sensor and located along a side of said feedthrough externally of said housing.

5. An electrical apparatus, especially for use in an explosive environment, comprising:
    a pressure-retentive housing having a wall formed with an opening;
    an electrical unit received in said housing;
    a cable feedthrough received in said opening and sealing the interior of said housing from the environment at said opening;
    an electrical cable comprising a plurality of electrical conductors within a sheath, said electrical cable traversing said feedthrough and said electrical conductors being connected to said unit;
    a passage extending through said feedthrough and into said housing for pressurizing the interior of said housing with a gas under pressure;
    means on a side of said feedthrough disposed externally of said housing for feeding gas under pressure to said passage, said means on said side of said feedthrough including a fitting connectable to an externally pressurized gas line; and
    said passage formed by a tube within said cable and running through said means on said side of said feedthrough to said fitting.

6. The apparatus defined in claim 5 wherein said means on said side of said feedthrough includes a member received therein and forming said fitting.

7. The apparatus defined in claim 6 wherein said member is provided with a check valve for said passage.

8. An electrical apparatus, especially for use in an explosive environment, comprising:
    a pressure-retentive housing having a wall formed with an opening;
    an electrical unit received in said housing;

a cable feedthrough received in said opening and sealing the interior of said housing from the environment at said opening;

an electrical cable comprising a plurality of electrical conductors within a sheath, said electrical cable traversing said feedthrough and said electrical conductors being connected to said unit;

a passage extending through said feedthrough and into said housing for pressurizing the interior of said housing with a gas under pressure; and means on a side of said feedthrough disposed externally of said housing for feeding gas under pressure to said passage, said means on said side of said feedthrough including a fitting connectable to an externally pressurized gas line, said means on said side of said feedthrough including an annular passage opening into said cable and communicating with an interstitial space formed therein for a limited portion of the length of said cable and communicating with the interior of said housing.

* * * * *